(12) United States Patent
Kita et al.

(10) Patent No.: US 10,269,631 B2
(45) Date of Patent: Apr. 23, 2019

(54) MANUFACTURING METHOD OF SEMICONDUCTOR DEVICE

(71) Applicant: Renesas Electronics Corporation, Tokyo (JP)

(72) Inventors: Kentaro Kita, Ibaraki (JP); Takeshi Hayashi, Ibaraki (JP); Koji Ikuta, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 5 days.

(21) Appl. No.: 15/679,310

(22) Filed: Aug. 17, 2017

(65) Prior Publication Data

US 2018/0082891 A1 Mar. 22, 2018

(30) Foreign Application Priority Data

Sep. 20, 2016 (JP) .................................. 2016-182803

(51) Int. Cl.
H01L 21/4763 (2006.01)
H01L 21/768 (2006.01)
H01L 21/02 (2006.01)

(52) U.S. Cl.
CPC .... *H01L 21/76868* (2013.01); *H01L 21/0209* (2013.01); *H01L 21/02087* (2013.01); *H01L 21/7684* (2013.01); *H01L 21/76802* (2013.01); *H01L 21/76843* (2013.01); *H01L 21/76877* (2013.01)

(58) Field of Classification Search
CPC .......... H01L 21/0209; H01L 21/76868; H01L 21/76802; H01L 21/7684; H01L 21/76843; H01L 21/76877
USPC .................................................. 438/627, 643
See application file for complete search history.

(56) References Cited

U.S. PATENT DOCUMENTS

2007/0173050 A1* 7/2007 Ichinose ........... H01L 21/28556
438/597
2008/0003796 A1* 1/2008 Jeong ................ H01L 21/28562
438/597

FOREIGN PATENT DOCUMENTS

JP 07-273045 A 10/1995
JP 10-107032 A 4/1998
JP 11-145085 A 5/1999

* cited by examiner

*Primary Examiner* — Brook Kebede
(74) *Attorney, Agent, or Firm* — McDermott Will & Emery LLP

(57) ABSTRACT

As a barrier metal film, a titanium film is formed by a sputtering process, and a titanium nitride film is formed to cover the titanium film by a CVD process. Next, the back surface of a semiconductor substrate is cleaned by spraying a cleaning chemical liquid toward the back surface thereof, and a portion of the barrier metal film located in the outer peripheral portion is removed by causing the cleaning chemical liquid to wrap around toward the surface side of the outer peripheral portion from the back surface side. Next, a tungsten film is formed to cover the barrier metal film by a CVD process.

13 Claims, 14 Drawing Sheets

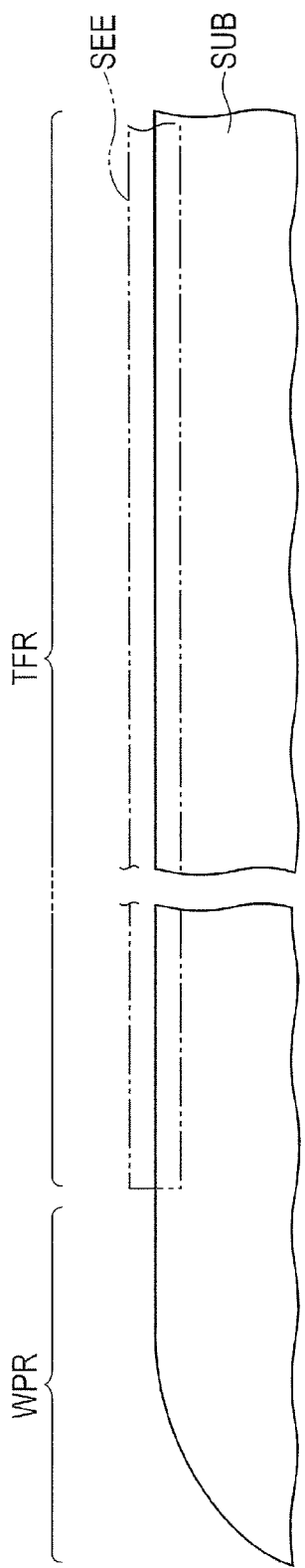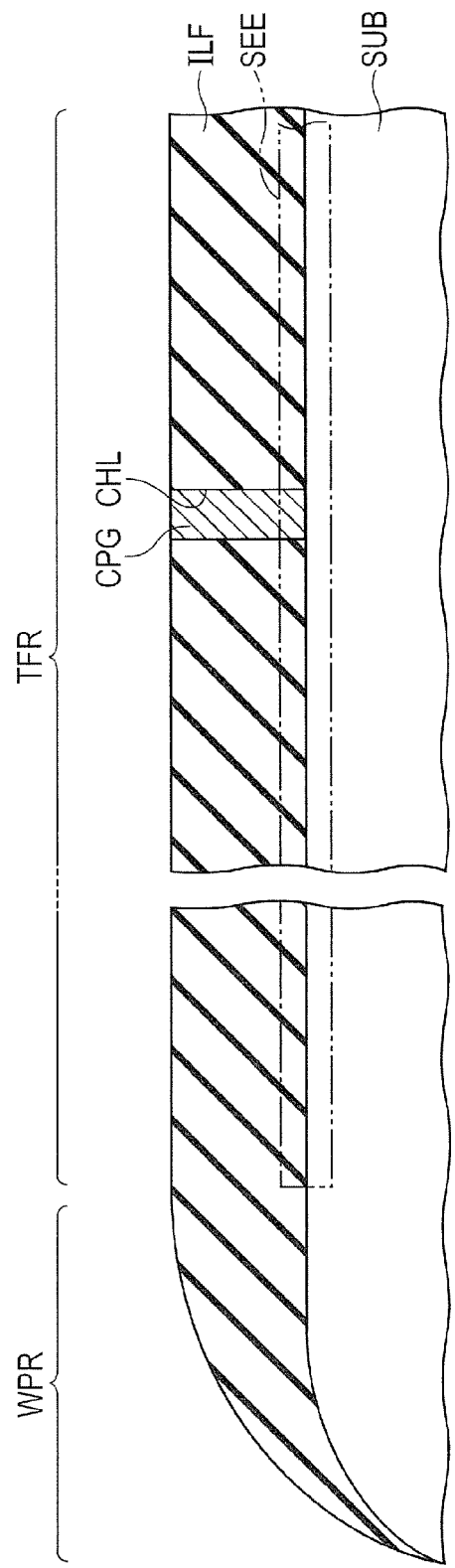

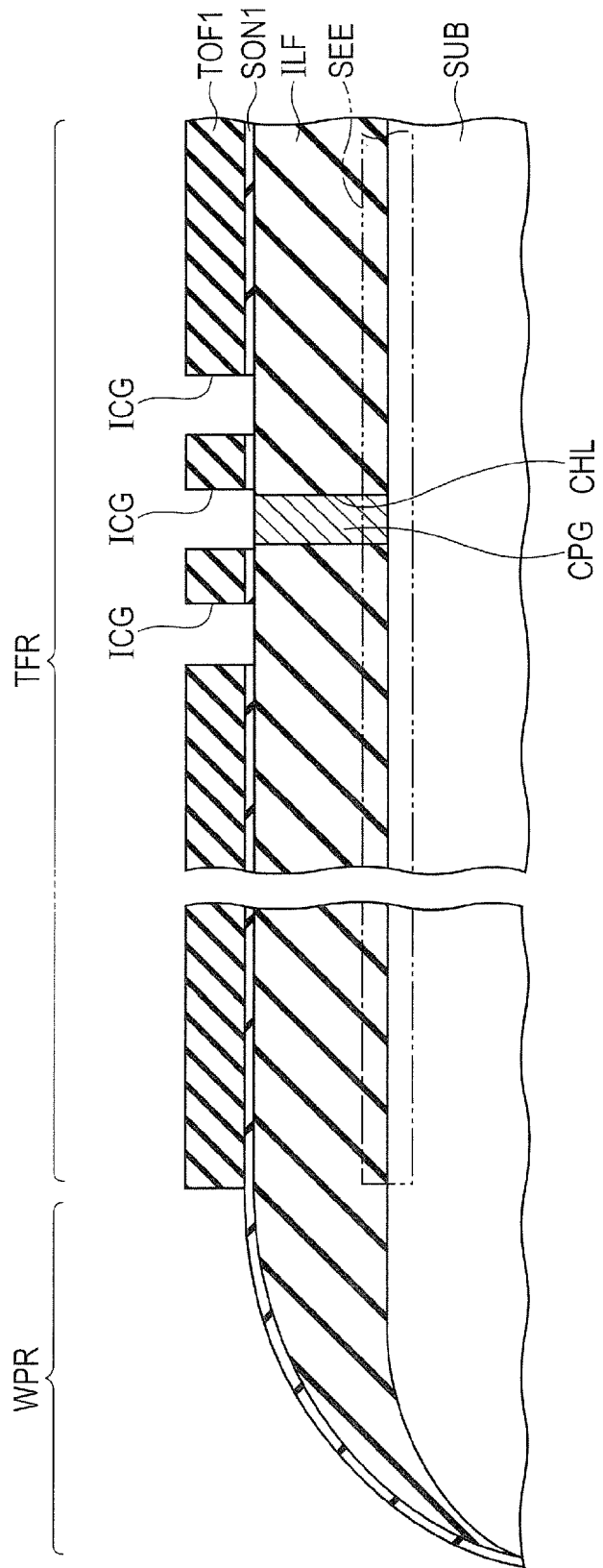

MANUFACTURING METHOD OF SEMICONDUCTOR DEVICE

CROSS-REFERENCE TO RELATED APPLICATIONS

The disclosure of Japanese Patent Application No. 2016-182803 filed on Sep. 20, 2016 including the specification, drawings and abstract is incorporated herein by reference in its entirety.

BACKGROUND

The present invention relates to a semiconductor device and a manufacturing method thereof, and can be suitably used in a semiconductor device including, for example, a titanium film as a barrier metal film and a tungsten film as a material of a wiring layer and the like.

A multi-layer wiring structure is generally applied as a wiring structure of a semiconductor device. In the semiconductor device, an interlayer insulating film is formed to cover a semiconductor substrate over which a semiconductor element is formed, and the multi-layer wiring structure is formed over the interlayer insulating film. A damascene process is used as one process of forming the wiring.

In the damascene process, wiring trenches, corresponding to the pattern of the wiring layer, are formed in the insulating film. Next, a predetermined conductive film is formed to cover the insulating film with a barrier metal film interposed in the wiring trench. Next, a polishing process is performed to remove a portion of the conductive film located over the upper surface of the insulating film, so that the wiring layer is formed in the wiring trench.

In some semiconductor devices, a tungsten film is applied as a conductive film, and a laminated film of a titanium film (lower layer) and a titanium nitride film (upper layer) is applied as a barrier metal film. In order to form the tungsten film so as to fill a wiring trench, the tungsten film is formed by a CVD (Chemical Vapor Deposition) process. When the tungsten film is formed by a CVD process, tungsten hexafluoride ($WF_6$) is used as a material gas.

When the tungsten film is formed by tungsten hexafluoride, the tungsten hexafluoride may react with the titanium film of the underlying barrier metal film, thereby causing adhesiveness to decrease. This phenomenon becomes remarkable particularly in the outer peripheral portion of the semiconductor substrate where the thickness of the titanium nitride film covering the titanium film is small. Therefore, the problem that the tungsten film is peeled off due to the physical load applied during the polishing process of the tungsten film occurs remarkably in the outer peripheral portion of the semiconductor substrate (wafer).

In order to solve this problem, for example, Japanese Unexamined Patent Application Publication No. Hei 10(1998)-107032 proposes a technique of suppressing peeling of the tungsten film, in which the tungsten film is not formed in the outer peripheral portion of the semiconductor substrate by clamping the outer peripheral portion thereof with a clamp ring.

Further, Japanese Unexamined Patent Application Publication No. Hei 7(1995)-273045 proposes a technique of using two types of clamps when the tungsten film is formed. The proposed technique is as follows: in the stage of growing the nucleus of tungsten, a contact-type clamp, closely adhered to the outer peripheral portion of the semiconductor substrate, is used to prevent tungsten hexafluoride from wrapping around the outer peripheral portion thereof; and in the stage of forming a tungsten film as a bulk, the tungsten film is formed in the outer peripheral portion thereof by using a spaced clamp, spaced apart from the outer peripheral portion thereof.

Furthermore, Japanese Unexamined Patent Application Publication No. Hei 11(1999)-145085 proposes a technique of suppressing peeling of the tungsten film by nitriding the titanium film exposed in the outer peripheral portion of the semiconductor substrate to form a titanium nitride film.

SUMMARY

In a technique of forming a tungsten film by a CVD process, there is the problem that the tungsten film may be peeled off from the outer peripheral portion of a semiconductor substrate (wafer) by a reaction between tungsten hexafluoride and the underlying barrier metal film (titanium film), as described above.

Other problems and new characteristics will become clear from the description and accompanying drawings of the present specification.

A manufacturing method of a semiconductor device according to one embodiment includes the following steps. An insulating film is formed to cover the surface of a semiconductor substrate. An opening is formed in the insulating film. A barrier metal film including a titanium film is formed to cover the insulating film including the inside of the opening. Of the barrier metal film, a portion of the titanium film located in the outer peripheral portion of the semiconductor substrate is removed. A tungsten film is formed to cover the barrier metal film. A portion of the barrier metal film and a portion of the tungsten film located over the upper surface of the insulating film are removed with a portion of the barrier metal film and a portion of the tungsten film located in the opening left.

According to the manufacturing method of a semiconductor device of one embodiment, peeling of a tungsten film can be prevented.

BRIEF DESCRIPTION OF THE DRAWINGS

FIG. 1 is a sectional view illustrating one step of a manufacturing method of a semiconductor device according to an embodiment;

FIG. 2 is a sectional view illustrating a step performed after the step illustrated in FIG. 1, in the same embodiment;

FIG. 3 is a sectional view illustrating a step performed after the step illustrated in FIG. 2, in the same embodiment;

DETAILED DESCRIPTION

A manufacturing method of a semiconductor device according to an embodiment will be described. As illustrated in FIG. 1, a predetermined semiconductor element SEE such as a transistor is formed in a chip formation region TFR of a semiconductor substrate. In this specification, the semiconductor element SEE is represented by a rectangular two-dot chain line for simplification of drawing.

Next, an interlayer insulating film ILF including, for example, a silicon oxide film or the like is formed to cover the semiconductor element SEE, as illustrated in FIG. 2. Next, a contact hole CHL penetrating the interlayer insulating film ILF is formed by performing predetermined photoengraving process and etching process. Next, a contact plug CPG to be electrically coupled to the semiconductor element SEE is formed in the contact hole CHL.

Next, a silicon oxynitride film SON1 is formed to cover the interlayer insulating film ILF, as illustrated in FIG. 3. Next, a silicon oxide film TOF1 including, for example, a TEOS (Tetra Ethyl Ortho Silicate) oxide film is formed to cover the silicon oxynitride film SON1. Next, wiring trenches ICG corresponding to a line pattern are formed in the silicon oxide film TOF1 by performing predetermined photoengraving process and etching process.

Figure 4:
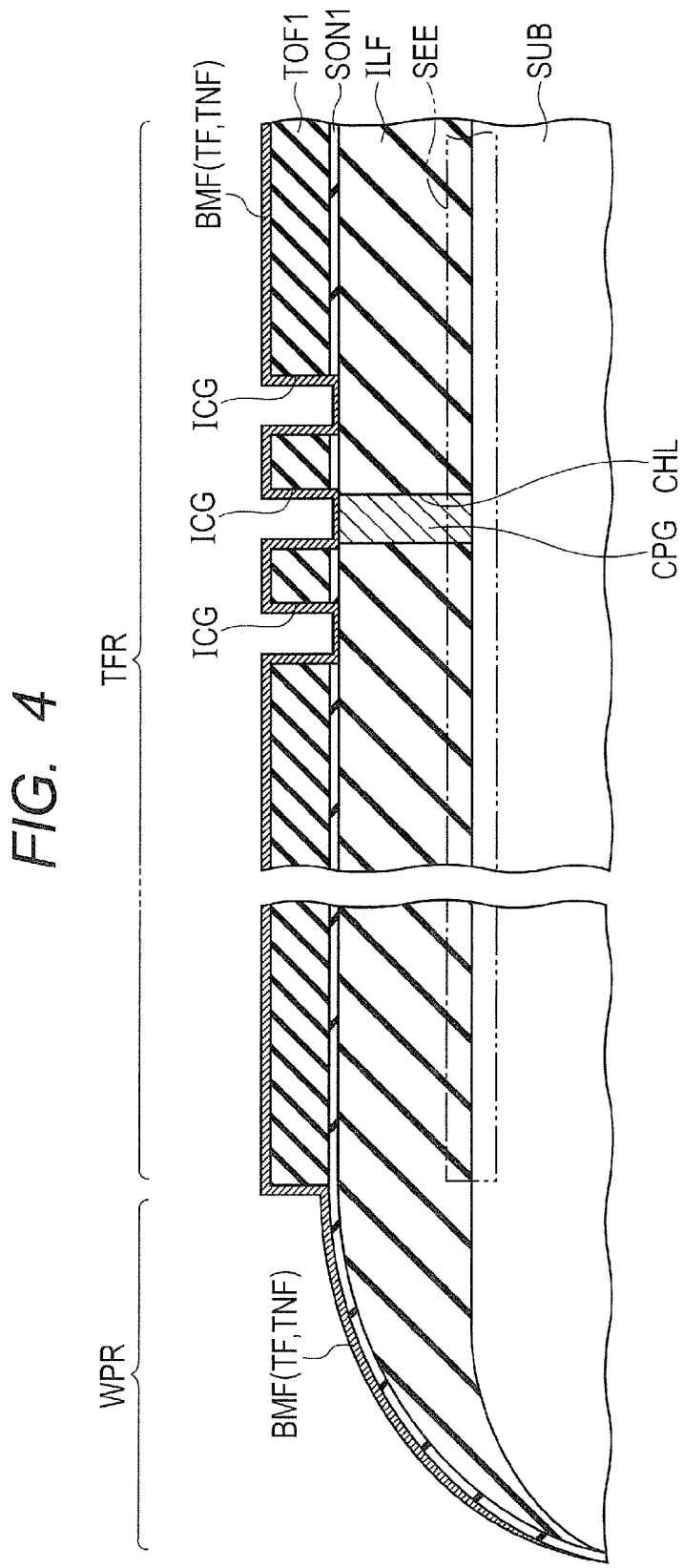
FIG. 4 is a sectional view illustrating a step performed after the step illustrated in FIG. 3, in the same embodiment.

Next, a barrier metal film BMF is formed as illustrated in FIG. 4. The barrier metal film BMF is a laminated film of a titanium film TF (lower layer) and a titanium nitride film TNF (upper layer). First, the titanium film TF is formed to cover the silicon oxide film TOF1 including the inside of the wiring trench ICG by a sputtering process. Next, the titanium nitride film TNF is formed to cover the titanium film TF by a CVD process.

Figure 5:
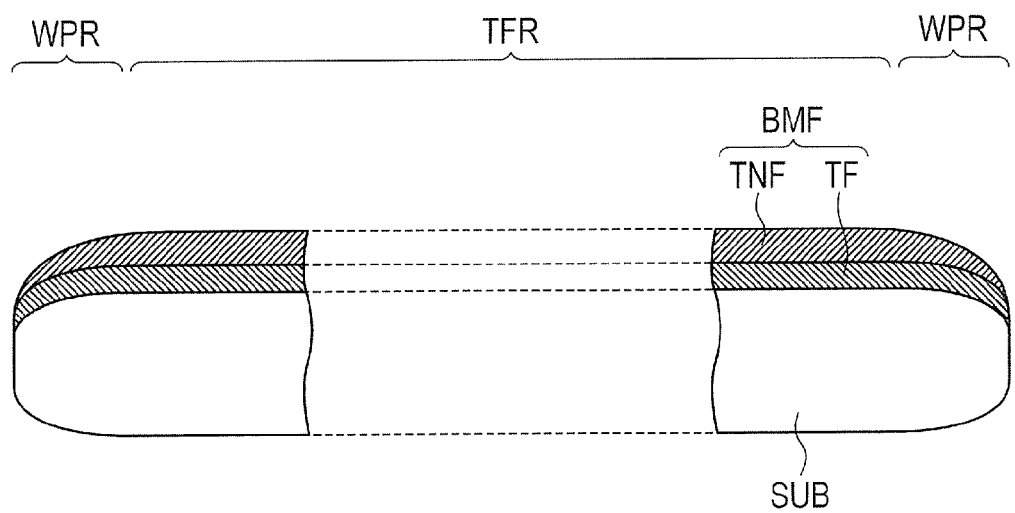
FIG. 5 is a sectional view illustrating the entire semiconductor substrate in the step illustrated in FIG. 4, in the same embodiment.

At this time, in an outer peripheral portion WPR of the semiconductor substrate SUB, the thickness of the titanium nitride film TNF becomes smaller than in the chip formation region TFR, as illustrated in FIGS. 4 and 5. In FIG. 5, only the barrier metal film BMF is illustrated and the interlayer insulating film is not illustrated for convenience of description. Further, the outer peripheral portion WPR is, for example, a region of approximately 1.5 to 2 mm from the end of the semiconductor substrate SUB.

Figure 6:
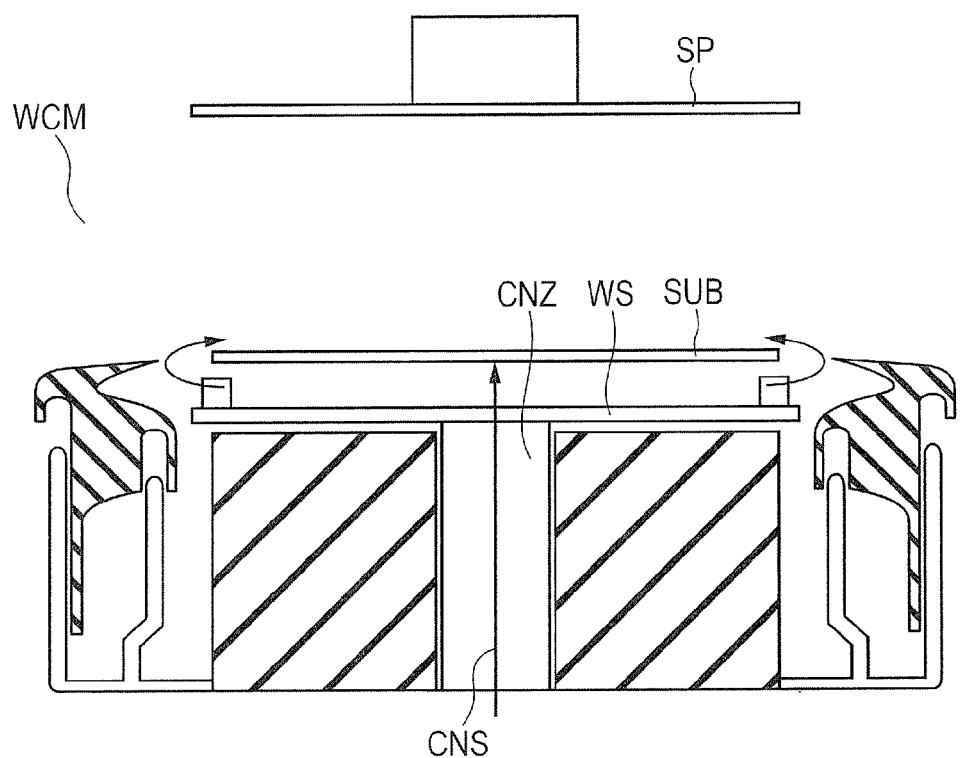
FIG. 6 is a side view partially including a section, illustrating a step of removing a portion of a barrier metal film located in the outer peripheral portion of the semiconductor substrate with a wet etching apparatus, which is performed after the step illustrated in FIG. 4, in the same embodiment.

Next, a portion of the barrier metal film BMF located in the outer peripheral portion WPR of the semiconductor substrate SUB is removed. Herein, it is performed in conjunction with cleaning of the back surface of the semiconductor substrate SUB. As illustrated in FIG. 6, the semiconductor substrate SUB is mounted over a wafer stage WS of a wet cleaning apparatus WCM in such a manner that the back surface of the semiconductor substrate SUB faces the wafer stage WS. A shielding plate SP for preventing scattering of a cleaning chemical liquid is arranged above the wafer stage WS (semiconductor substrate SUB). The wafer stage WS is provided with a chemical liquid nozzle CNZ for spraying a cleaning chemical liquid for cleaning the back surface.

Figure 7:
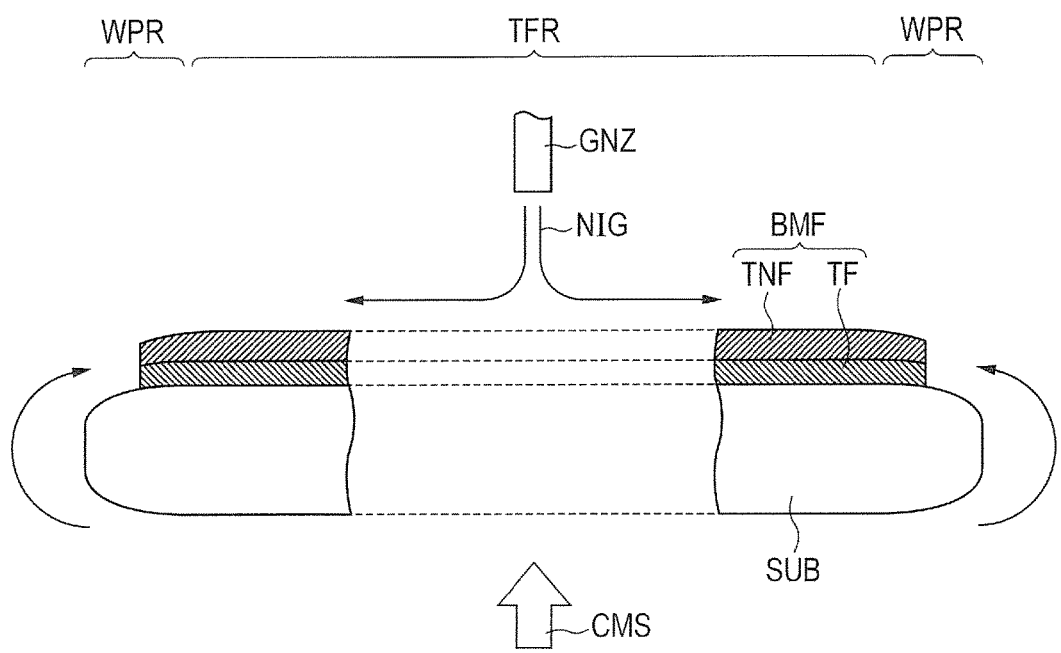
FIG. 7 is a sectional view illustrating the entire semiconductor substrate for explaining the step illustrated in FIG. 6, in the same embodiment.

A gas nozzle GNZ for spraying an inert gas, such as nitrogen gas, toward the surface of the semiconductor substrate SUB (see FIG. 7) is arranged between the shielding plate SP and the wafer stage WS. Next, a cleaning chemical liquid CMS is sprayed from the chemical liquid nozzle CNZ toward the back surface of the semiconductor substrate SUB, as illustrated in FIGS. 6 and 7. For example, a mixed liquid of sulfuric acid and hydrogen peroxide solution (SPM: sulfuric acid-hydrogen peroxide mixture) is used as the cleaning chemical liquid.

The cleaning chemical liquid CMS sprayed near the center of the back surface of the semiconductor substrate SUB flows from near the center thereof toward the outer periphery of the semiconductor substrate SUB and wraps around toward the surface of the outer peripheral portion WPR (see the arrows). With the cleaning chemical liquid CMS wrapping around toward the surface of the outer peripheral portion WPR, the portion of the barrier metal film BMF including the titanium film TF, located in the outer peripheral portion WPR, is removed.

Figure 8:
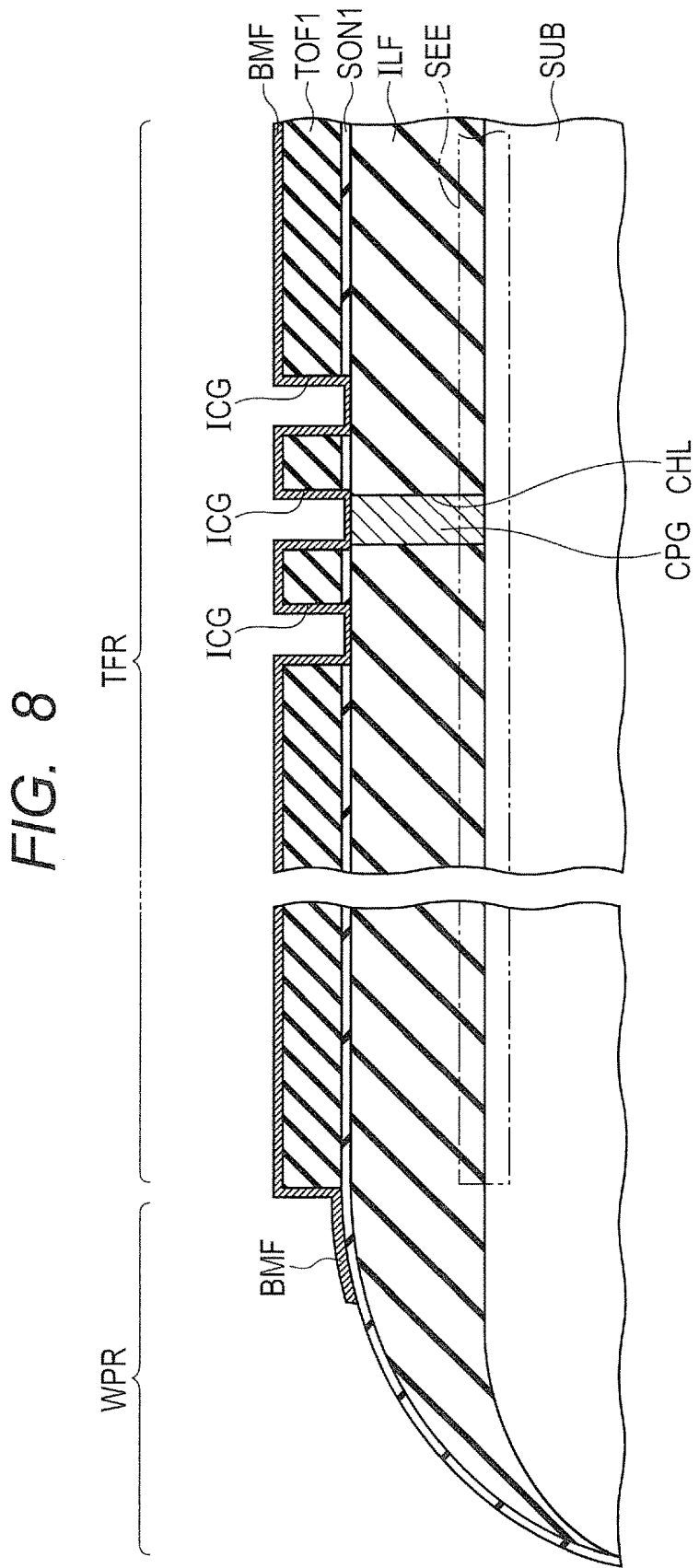
FIG. 8 is a sectional view illustrating a step performed after the step illustrated in FIG. 6, in the same embodiment.

At this time, flowing of the cleaning chemical liquid CMS into the chip formation region TFR can be prevented by spraying nitrogen gas NIG from the gas nozzle GNZ onto the surface of the semiconductor substrate SUB. The width (region) of the portion of the barrier metal film BMF located in the outer periphery WPR, which is to be removed, is controlled by the number of revolutions of the semiconductor substrate SUB. In this way, the portion of the barrier metal film BMF located in the outer peripheral portion WPR is removed in conjunction with the cleaning of the back surface of the semiconductor substrate SUB, as illustrated in FIG. 8.

Figure 9:
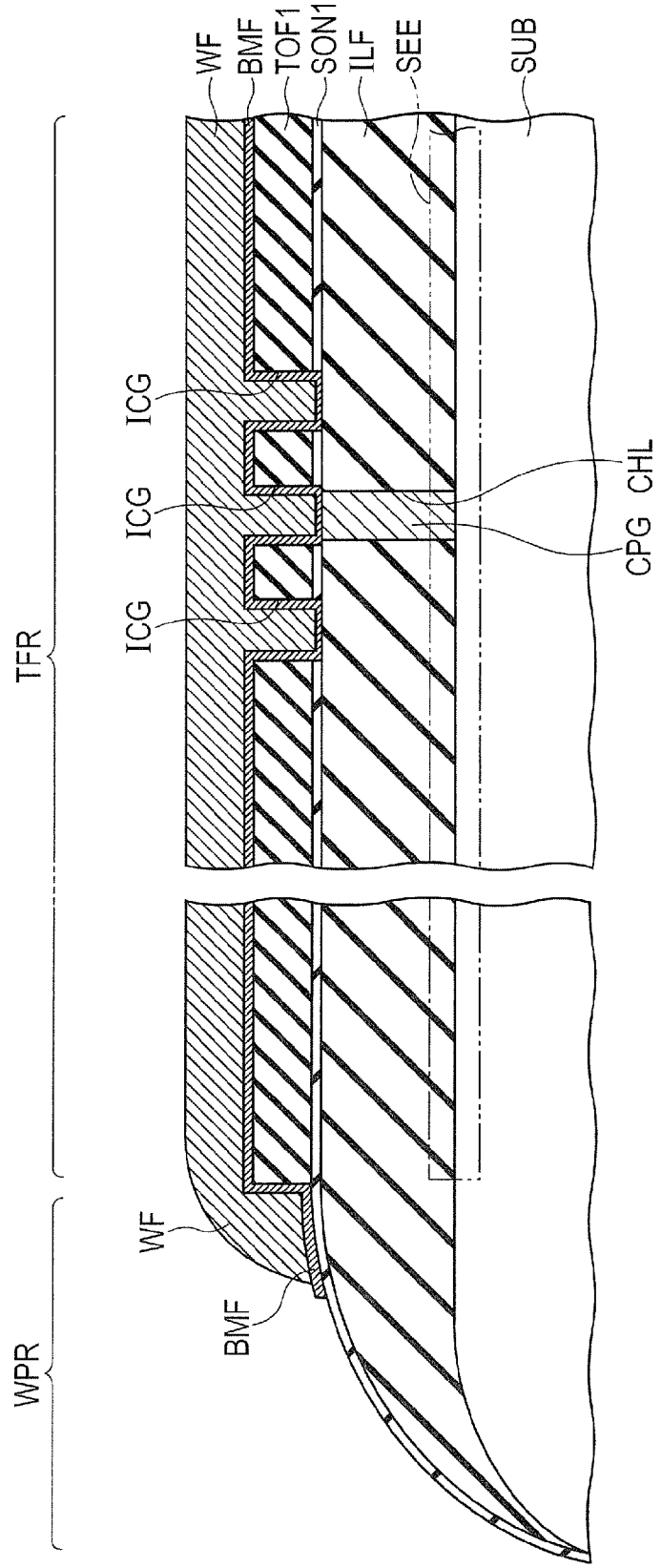
FIG. 9 is a sectional view illustrating a step performed after the step illustrated in FIG. 8, in the same embodiment.

Next, a tungsten film WF is formed as illustrated in FIG. 9. The tungsten film WF is formed by a CVD process. The temperature of the semiconductor substrate SUB is set to approximately 400° C. to 500° C. The pressure is set to approximately several Torr to 100 Torr (approximately 133 Pa to 13300 Pa). A process of forming the tungsten film WF mainly includes three steps: i.e., an $SiH_4$ irradiation step (pre-nucleation), a nucleation step, and a main depot step.

First, in the $SiH_4$ irradiation step, only $SiH_4$ (no supply of $WF_6$) is supplied to the semiconductor substrate SUB such that ultrathin amorphous Si of several nm level in thickness is deposited. This is to stabilize the growth of the tungsten film in the next nucleation step.

Next, in the nucleation step, the tungsten film is formed by an $SiH_4$ reduction reaction ($2WF_6+3SiH_4 \rightarrow 2W+3SiF_4+6H_2$). This tungsten film serves as a film for stabilizing the next main depot step. In this process, the step coverage performance is inferior to that in the case of an $H_2$ reduction reaction, and hence the thickness of the tungsten film to be formed is set to approximately 100 nm or less.

Then, in the main depot step, the tungsten film is formed by an $H_2$ reduction reaction ($WF_6+3H_2 \rightarrow W+6HF$). This film formation is excellent in step coverage performance, and most portion (thickness) of the tungsten film is formed in this main depot step.

In the step of forming the tungsten film WF, the portion of the barrier metal film BMF located in the outer peripheral portion WPR of the semiconductor substrate SUB is removed in advance. Thereby, tungsten hexafluoride ($WF_6$) never reacts with the underlying barrier metal film (titanium film) in the outer peripheral portion WPR of the semiconductor substrate SUB. This will be described later.

Figure 10:
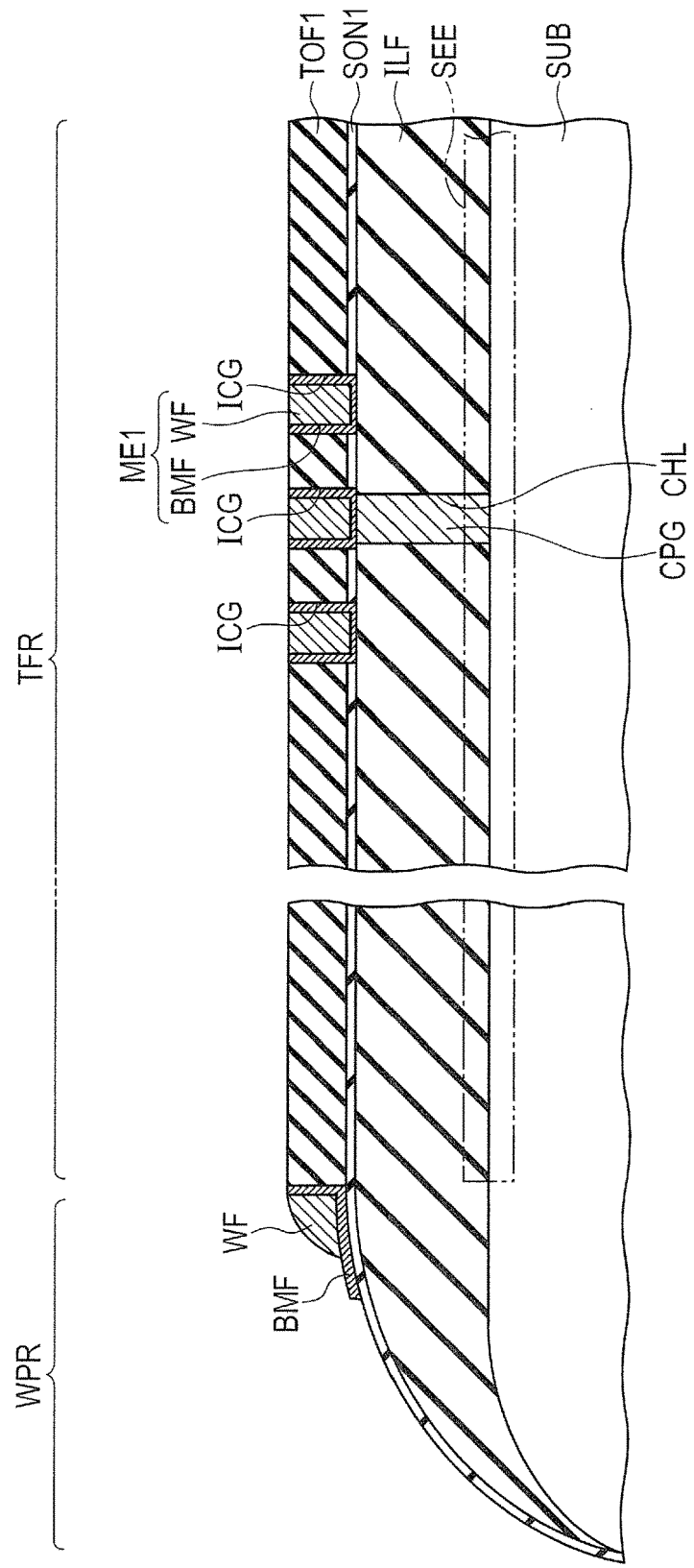
FIG. 10 is a sectional view illustrating a step performed after the step illustrated in FIG. 9, in the same embodiment.

Next, by performing chemical mechanical polishing (CMP) on the tungsten film WF and the like, a portion of the tungsten film WF and a portion of the barrier metal film BMF located over the upper surface of the silicon oxide film TOF1 are removed, with a portion of the tungsten film WF and a portion of the barrier metal film BMF located in the wiring trench ICG left, as illustrated in FIG. 10. Thus, the portion of the tungsten film WF and the portion of the barrier metal film BMF left in the wiring trench ICG form a wiring layer ME1 of the first layer.

Figure 11:
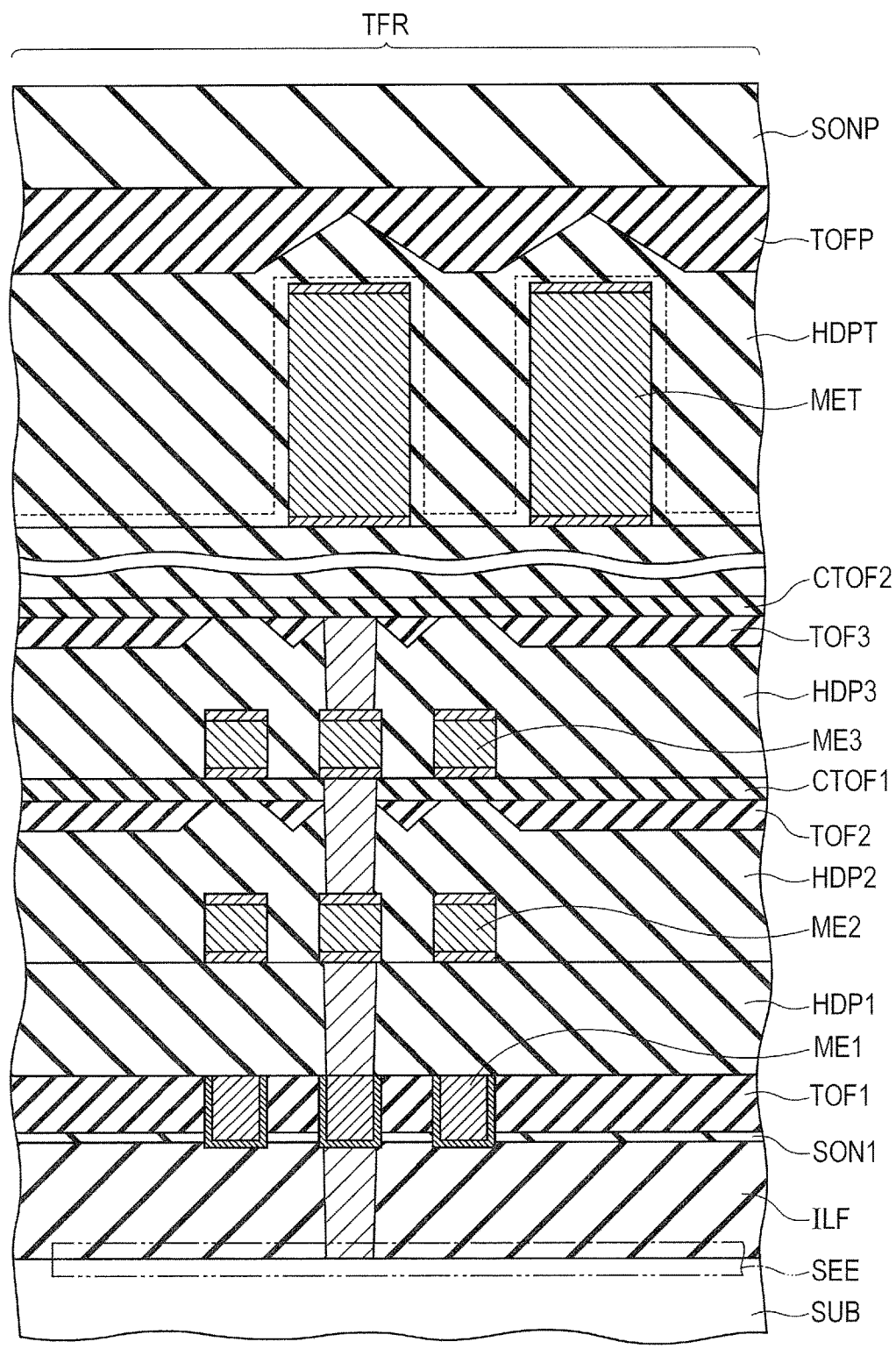
FIG. 11 is a partial sectional view illustrating a step performed after the step illustrated in FIG. 10, in the same embodiment.

Next, a multilayer wiring structure further including wiring layers of upper layers is formed as illustrated in FIG. 11. Herein, the chip formation region TFR is illustrated. A silicon oxide film HDP1 is formed to cover the wiring layer ME1 by a high density plasma process. An aluminum wiring layer ME2 is formed over the surface of the silicon oxide film HDP1 by patterning the aluminum film and the like.

Next, a silicon oxide film HDP2 is formed to cover the aluminum wiring layer ME2 by a high density plasma process. A silicon oxide film TOF2 is formed to cover the silicon oxide film HDP2. Next, the silicon oxide film TOF2 and the silicon oxide film HDP2 are flattened. Next, a silicon oxide film CTOF1 as a cap oxide film is formed to cover the silicon oxide film TOF 2 and the like.

Next, an aluminum wiring layer ME3 is formed over the surface of the silicon oxide film CTOF1 by patterning the aluminum film and the like. A silicon oxide film HDP3 and a silicon oxide film TOF3 are formed to cover the aluminum wiring layer ME3, which are then flattened. Next, the wiring layer of a further upper layer (not illustrated) is formed, if necessary, and then an aluminum wiring layer MET of the uppermost layer, a silicon oxide film HDPT covering the aluminum wiring layer MET, a silicon oxide film TOFP, and a silicon oxynitride film SONP are formed. Thus, the main part of the semiconductor device is completed.

In the above manufacturing method of a semiconductor device, the portion of the barrier metal film BMF (titanium film TF) located in the outer peripheral portion WPR of the semiconductor substrate SUB is removed in advance, when the tungsten film WF to serve as the wiring layer ME1 is formed. Thereby, tungsten hexafluoride ($WF_6$) never reacts with the titanium film TF in the outer peripheral portion WPR of the semiconductor substrate SUB, whereby peeling of the tungsten film WF can be prevented. This will be described in comparison with a manufacturing method of a semiconductor device according to a comparative example. In the comparative example, the same members as those of the above semiconductor device will be denoted with the same reference numerals and description thereof will not be repeated unless necessary.

Figure 12:
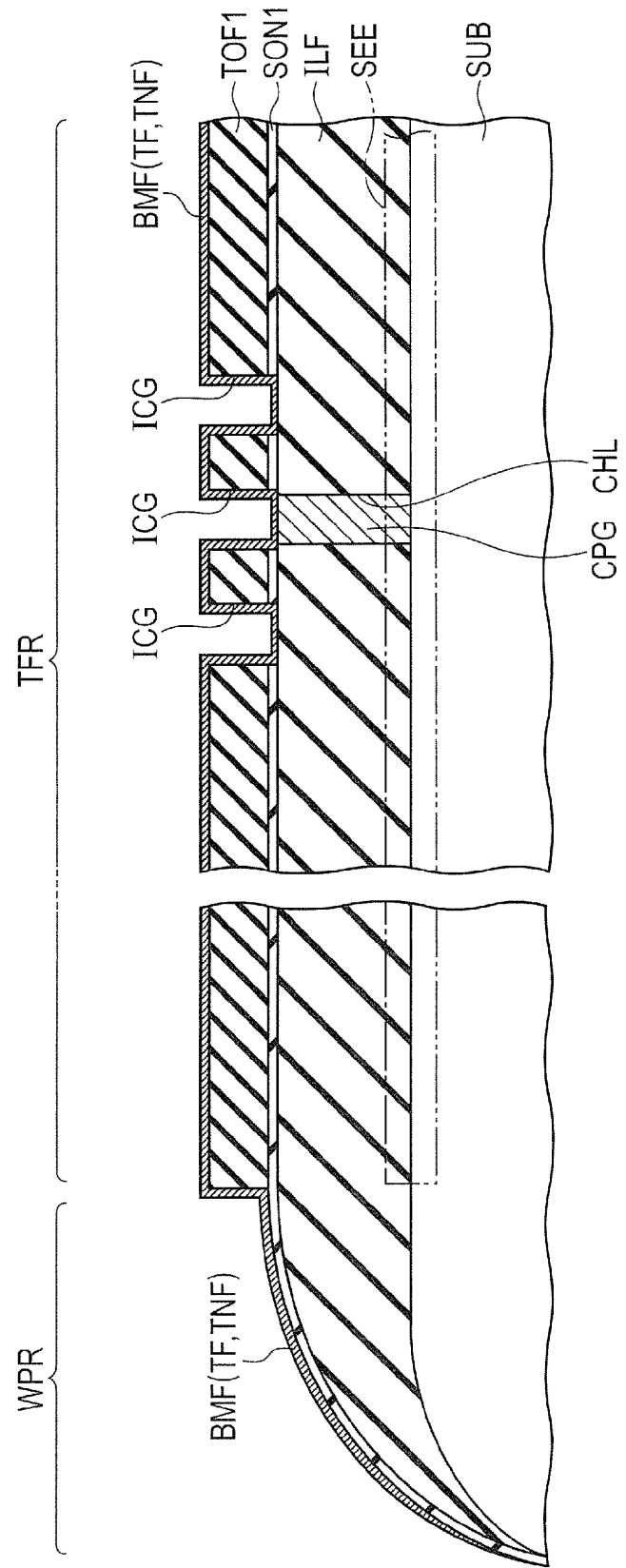
FIG. 12 is a sectional view illustrating one step of a manufacturing method of a semiconductor device according to a comparative example.

First, the barrier metal film BMF is formed through the steps similar to those illustrated in FIGS. 1 to 4, as illustrated in FIG. 12. The titanium film TF is formed to cover the silicon oxide film TOF1 by a sputtering process. Next, the titanium nitride film TNF is formed to cover the titanium film TF by a CVD process. At this time, in the outer peripheral portion WPR of the semiconductor substrate SUB, the thickness of the titanium nitride film TNF becomes smaller than in the chip formation region TFR.

Figure 13:
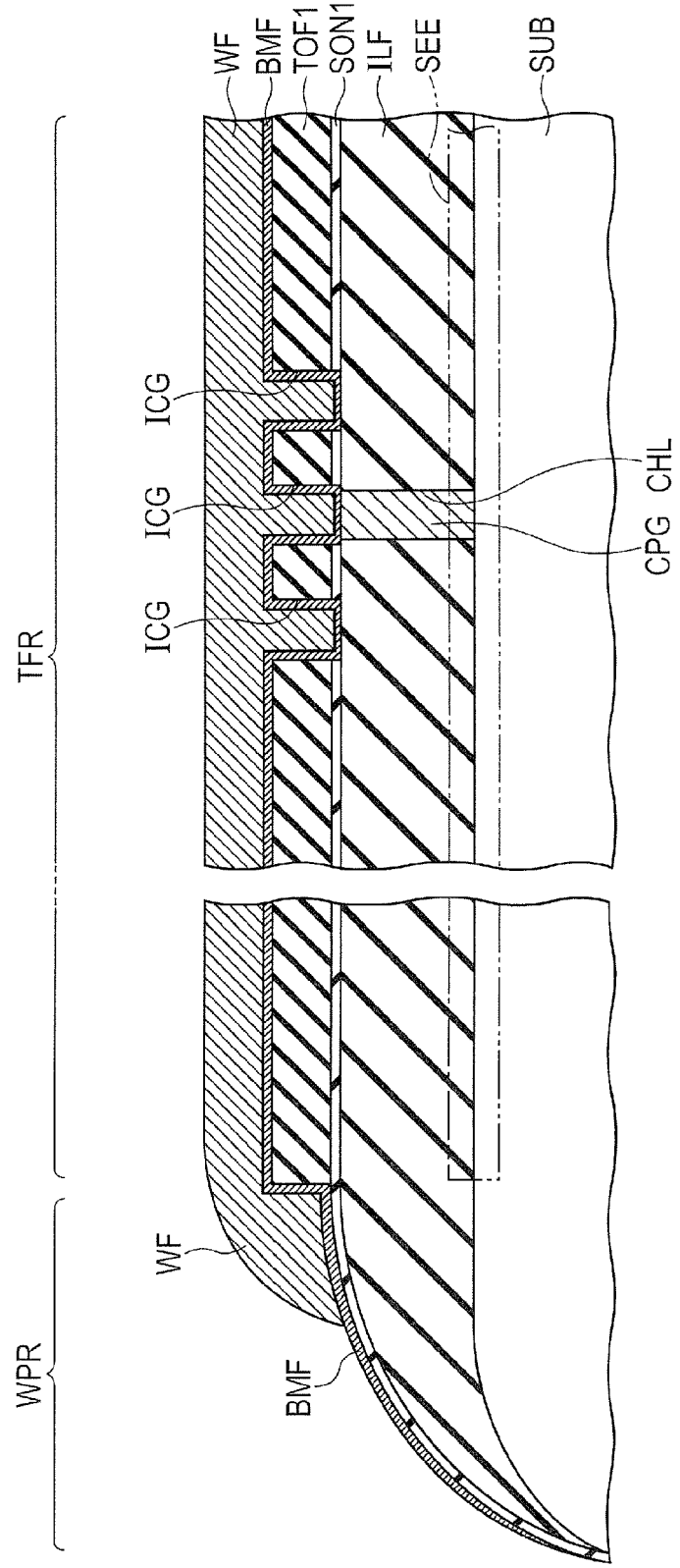
FIG. 13 is a sectional view illustrating a step performed after the step illustrated in FIG. 12.

Next, the tungsten film WF is formed by a CVD process, as illustrated in FIG. 13. At this time, the tungsten film WF is formed by three steps including an $SiH_4$ irradiation step, a nucleation step, and a main depot step, similarly to the description with reference to FIG. 9.

Herein, it is generally known that tungsten hexafluoride ($WF_6$) readily reacts with silicon (Si), aluminum (Al), or titanium (Ti). In the reaction between tungsten hexafluoride ($WF_6$) and silicon (Si) ($2WF_6+3Si \rightarrow 2W+3SiF_4$), for example, an impurity diffusion layer is corroded, so that junction breakdown may occur. In the reaction between tungsten hexafluoride ($WF_6$) and aluminum (Al) ($WF_6+2Al \rightarrow W+2AlF_3$), high-resistant $AlF_3$ is formed, so that, for example, through hole contact resistance may increase. In the reaction between tungsten hexafluoride ($WF_6$) and titanium (Ti) ($2WF_6+3Ti \rightarrow 2W+3TiF_4$), corrosion occurs and film peeling may occur.

The barrier metal film BMF of a laminated film including the titanium film TF (lower layer) and the titanium nitride film TNF (upper layer) is formed as an underlayer over which the tungsten film WF is to be formed. Because the adhesion between the tungsten film WF and the interlayer insulating film ILF is low, the titanium nitride film TNF is formed as an adhesive film for enhancing the adhesion with the tungsten film. On the other hand, the titanium film TF is formed as a film for enhancing the adhesion with the interlayer insulating film ILF and reducing the contact resistance with the contact plug CPG and the like.

This titanium nitride film TNF serves as a barrier film for preventing the titanium film TF from being directly exposed to tungsten hexafluoride ($WF_6$). Therefore, it is important as a countermeasure against damage that the titanium nitride film TNF is formed with a sufficient thickness considering the diffusion of tungsten hexafluoride ($WF_6$) into the titanium nitride film TNF.

For the titanium nitride film TNF, it is required to lower the resistance of the wiring layer or the via. In addition, it is required to ensure good coverage of the wiring trench and the like where the wiring layer and the like are formed. From these points of view, it is becoming important to reduce the thickness of the titanium nitride film TNF.

When the thickness of the titanium nitride film TNF is reduced, it becomes difficult to secure the barrier property of the titanium film TF for tungsten hexafluoride ($WF_6$). Particularly, in the outer peripheral portion WPR of the semiconductor substrate SUB, the thickness of the titanium nitride film TNF becomes smaller than in chip formation region TFR due to the characteristics of a manufacturing apparatus.

For this reason, it becomes increasingly difficult to protect the titanium film TF from tungsten hexafluoride ($WF_6$), and when the tungsten film WF is formed, titanium (Ti) more easily reacts with tungsten hexafluoride ($WF_6$) ($2WF_6+3Ti \rightarrow 2W+3TiF_4$).

Figure 14:
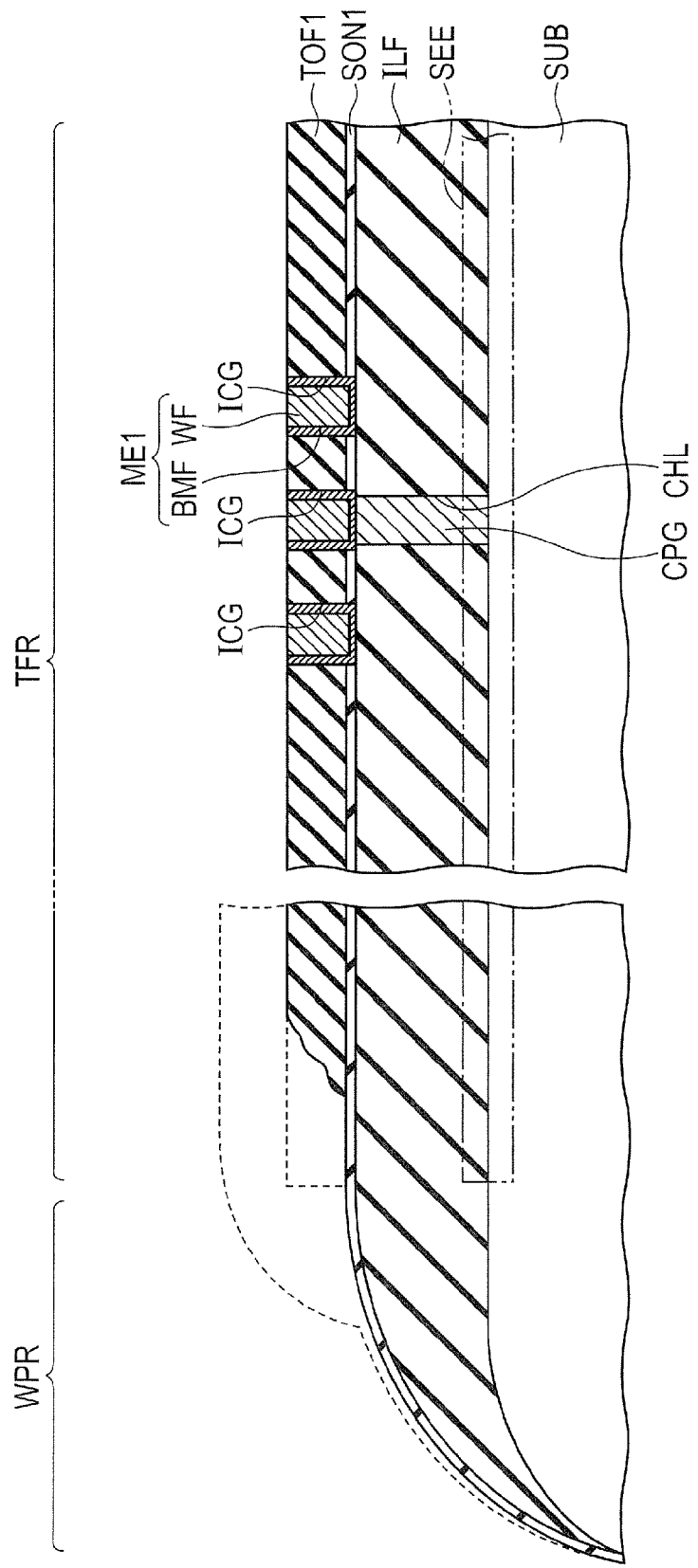
FIG. 14 is a sectional view for explaining a problem of the manufacturing method of a semiconductor device according to the comparative example.

As a result, the tungsten film WF and the like are peeled off from the outer peripheral portion WPR of the semiconductor substrate SUB, as illustrated in FIG. 14, and they become foreign matters, which may be one of the factors that lower the yield of a semiconductor device.

In the semiconductor device according to the embodiment, the portion of the titanium nitride film TNF having a relatively small thickness and the portion of the titanium film TF, which are located in the outer peripheral portion WPR of the semiconductor substrate SUB, are removed before the tungsten film WF is formed, unlike the semiconductor device according to the comparative example. Thereby, when the tungsten film WF is formed, the titanium film TF never reacts with tungsten hexafluoride ($WF_6$) in the outer peripheral portion WPR of the semiconductor substrate SUB, whereby peeling of the tungsten film WF can be prevented.

(First Variation)

In the above manufacturing method of a semiconductor device, the case has been described, in which the removal of the portion of the barrier metal film BMF located in the outer peripheral portion WPR of the semiconductor substrate SUB is performed in conjunction with the cleaning of the back surface of the semiconductor substrate SUB. Herein, as First Variation thereof, a technique of removing the barrier metal film (titanium film) by spraying a chemical liquid onto the outer peripheral portion of the semiconductor substrate will be described.

Figure 15:
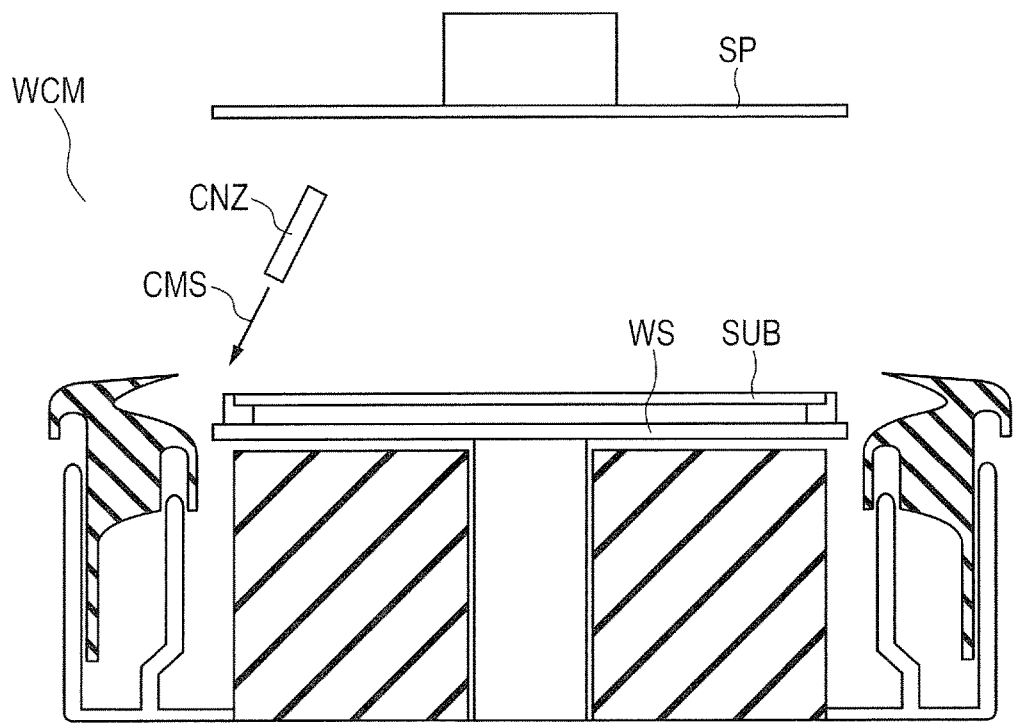
FIG. 15 is a side view partially including a section, illustrating a step of removing a portion of a barrier metal film located in the outer peripheral portion of a semiconductor substrate with a wet etching apparatus, according to First Variation of the same embodiment.

As illustrated in FIG. 15, the semiconductor substrate SUB is placed over the wafer stage WS of the wet cleaning apparatus WCM with the surface of the semiconductor substrate SUB facing upward. The shielding plate SP for preventing scattering of the chemical liquid is arranged above the semiconductor substrate SUB. The chemical liquid nozzle CNZ for spraying a cleaning chemical liquid is arranged between the shielding plate SP and the semiconductor substrate SUB.

Figure 16:
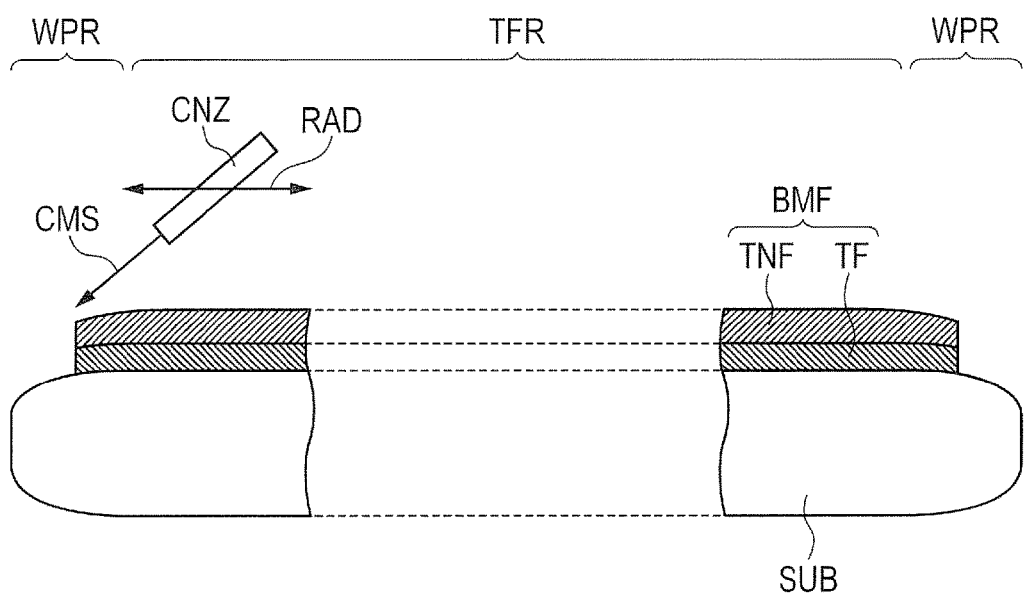
FIG. 16 is a sectional view illustrating the entire semiconductor substrate for explaining the step illustrated in FIG. 15, in the same variation.

As illustrated in FIGS. 15 and 16, the cleaning chemical liquid CMS is sprayed toward the outer peripheral portion on the surface side of the semiconductor substrate SUB. For example, a mixed liquid of ammonia and hydrogen peroxide solution (APM: Ammonium hydroxide-hydrogen peroxide mixture) or a mixed liquid of hydrofluoric acid and hydrogen peroxide solution (FPM: hydrofluoric acid-hydrogen peroxide mixture) is used as the cleaning chemical liquid.

The portion of the barrier metal film BMF including the titanium film TF located in the outer peripheral portion WPR is removed by spraying the cleaning chemical liquid CMS onto the outer peripheral portion of the semiconductor substrate SUB. At this time, the width (region) of the portion of the barrier metal film BMF located in the outer peripheral portion WPR, which is to be removed, is controlled by both a scan width RAD through which the chemical liquid nozzle CNZ is scanned in the radial direction of the semiconductor substrate SUB and the number of revolutions of the semiconductor substrate SUB. According to this technique, the portion of the barrier metal film BMF (titanium film TF) located in the outer peripheral portion WPR of the semiconductor substrate SUB can also be removed, as illustrated in FIG. 16.

(Second Variation)

Herein, as Second Variation of the technique of removing the portion of the barrier metal film BMF located in the outer peripheral portion WPR of the semiconductor substrate SUB, a technique of removing the barrier metal film (titanium film) by using a bevel etching apparatus will be described.

Figure 17:
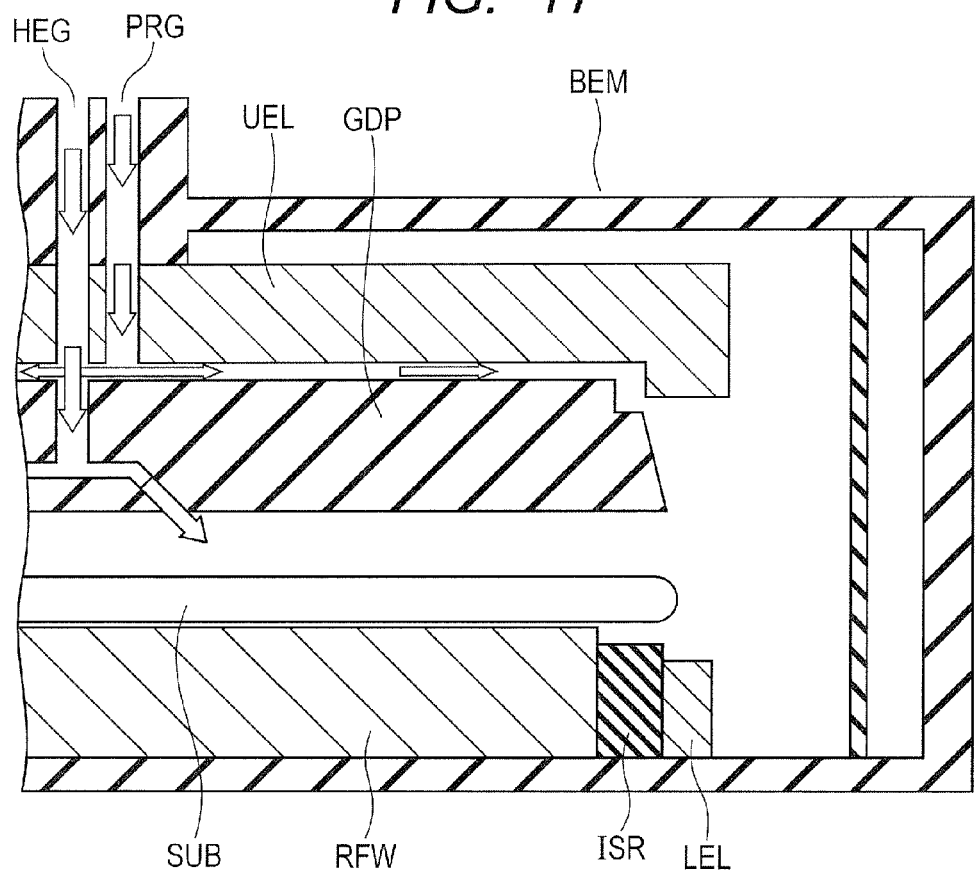
FIG. 17 is a side view partially including a section, illustrating a step of removing a portion of a barrier metal film located in the outer peripheral portion of a semiconductor substrate with a bevel etching apparatus, according to Second Variation of the same embodiment.

As illustrated in FIG. 17, the semiconductor substrate SUB is placed over a wafer stage RFW of a bevel etching apparatus BEM with the surface of the semiconductor substrate SUB facing upward. The wafer stage RFW also serves as an electrode to which high frequency power is to be applied. An upper electrode UEL is arranged above the wafer stage RFW. The upper electrode UEL is coupled to the ground potential.

A ring-shaped lower electrode LEL is arranged to surround the outer periphery of the wafer stage RFW. The lower electrode LEL is coupled to the ground potential. A ring-shaped insulating ring ISR is arranged between the wafer stage RFW and the lower electrode LEL. A shielding plate GDP is arranged between the wafer stage RFW (semiconductor substrate SUB) and the upper electrode UEL.

A gap, for allowing a process gas to flow toward the outer peripheral portion of the semiconductor substrate SUB, is provided between the upper electrode UEL and the shielding plate GDP. In the shielding plate GDP and the like, a passage for sending helium gas is provided in the space between the shielding plate GDP and the wafer stage RFW (semiconductor substrate SUB).

As illustrated in FIG. 17, a process gas PRG is sent toward the outer peripheral portion of the semiconductor substrate SUB through the gap between the upper electrode UEL and the shielding plate GDP. Further, helium gas HEG is sent into the space between the semiconductor substrate SUB and the shielding plate GDP such that the process gas PRG does not flow toward the chip formation region of the semiconductor substrate SUB. For example, tetrafluoromethane ($CF_4$), sulfur hexafluoride ($SF_6$) or oxygen ($O_2$) is used as the process gas PRG.

Figure 18:
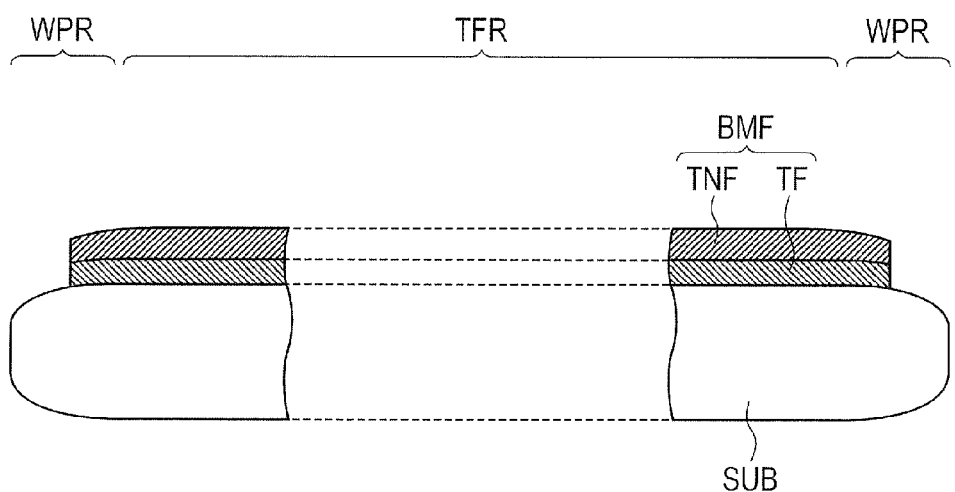
FIG. 18 is a sectional view illustrating the entire semiconductor substrate for explaining the step illustrated in FIG. 17, in the same variation.

Next, predetermined high-frequency power is applied to the wafer stage REF. As a result, plasma is generated in a ring shape in a region including the outer peripheral portion of the semiconductor substrate SUB. Etching processing is performed on the portion of the barrier metal film BMF (titanium film TF) located in the outer peripheral portion of the semiconductor substrate SUB by sending the process gas PRG into the generated plasma. In this way, the portion of the barrier metal film BMF located in the outer peripheral portion of the semiconductor substrate SUB is removed, as illustrated in FIG. 18.

In the above embodiment, the wiring layer ME1 including a tungsten film has been described as an example. The above technique is not limited to such a wiring layer ME1, but can be similarly applied to a tungsten via. Further, the method is not limited to the wiring layer ME1 of the first layer, but can also be applied to the case of forming a wiring layer including a tungsten film, for example, as a wiring layer of the second layer or more.

Various combinations of the manufacturing method of a semiconductor device described in the embodiment including the variations can be made as necessary.

The invention made by the present inventors has been specifically described above based on preferred embodiments, but it is needless to say that the invention should not be limited to the preferred embodiments and various modifications may be made to the invention within a range not departing from the gist of the invention.

What is claimed is:

1. A manufacturing method of a semiconductor device, comprising:
   forming an insulating film so as to cover a surface of a semiconductor substrate;
   forming an opening in the insulating film;
   forming a barrier metal film including a titanium film so as to cover the insulating film including the inside of the opening, the barrier metal film that includes the titanium film being formed on an outer peripheral portion of the semiconductor substrate;

removing, of the barrier metal film, a portion of the titanium film located in the outer peripheral portion of the semiconductor substrate;

forming a tungsten film so as to cover the barrier metal film after removing the portion of the titanium film located in the outer peripheral portion of the semiconductor substrate; and removing a portion of the barrier metal film and a portion of the tungsten film located over an upper surface of the insulating film, with a portion of the barrier metal film and a portion of the tungsten film located in the opening left.

2. The manufacturing method of a semiconductor device according to claim 1,
wherein the removing the portion of the titanium film located in the outer peripheral portion of the semiconductor substrate is performed simultaneously with cleaning a back surface of the semiconductor substrate by a first cleaning chemical liquid.

3. The manufacturing method of a semiconductor device according to claim 2,
wherein the cleaning the back surface of the semiconductor substrate by the first cleaning chemical liquid comprises mounting the semiconductor substrate over a wafer stage of a wet cleaning apparatus, and wherein the removing the portion of the titanium film located in the outer peripheral portion of the semiconductor substrate comprises controlling a number of revolutions of the semiconductor substrate on the wafer stage.

4. The manufacturing method of a semiconductor device according to claim 2,
wherein the removing the portion of the titanium film located in the outer peripheral portion of the semiconductor substrate is performed while an inert gas is spraying onto the surface of the semiconductor substrate.

5. The manufacturing method of a semiconductor device according to claim 2,
wherein the removing the portion of the titanium film located in the outer peripheral portion of the semiconductor substrate, a mixed liquid of sulfuric acid and hydrogen peroxide solution is used as the first cleaning chemical liquid.

6. The manufacturing method of a semiconductor device according to claim 1,
wherein the removing the portion of the titanium film located in the outer peripheral portion of the semiconductor substrate is performed by spraying a second cleaning chemical liquid onto the outer peripheral portion of the semiconductor substrate.

7. The manufacturing method of a semiconductor device according to claim 6,
wherein the spraying the second cleaning chemical liquid onto the outer peripheral portion of the semiconductor substrate comprises:
mounting the semiconductor substrate over a wafer stage of a wet cleaning apparatus; and
spraying the second cleaning chemical liquid through a first nozzle in a radial direction of the semiconductor substrate, wherein the removing the portion of the titanium film located in the outer peripheral portion of the semiconductor substrate comprises controlling, both a number of revolutions of the semiconductor substrate on the wafer stage and a scan width corresponding to movement of the first nozzle in the radial direction of the semiconductor substrate.

8. The manufacturing method of a semiconductor device according to claim 6,
wherein in the removing the portion of the titanium film located in the outer peripheral portion of the semiconductor substrate, a mixed liquid of hydrofluoric acid and hydrogen peroxide solution is used as the second cleaning chemical liquid.

9. The manufacturing method of a semiconductor device according to claim 6,
wherein in the removing the portion of the titanium film located in the outer peripheral portion of the semiconductor substrate, a mixed liquid of ammonia and hydrogen peroxide solution is used as the second cleaning chemical liquid.

10. The manufacturing method of a semiconductor device according to claim 1,
wherein in the removing the portion of the titanium film located in the outer peripheral portion of the semiconductor substrate, plasma etching processing is performed on the outer peripheral portion of the semiconductor substrate.

11. The manufacturing method of a semiconductor device according to claim 10,
wherein a fluorine-based gas is used in the plasma etching processing.

12. A manufacturing method of a semiconductor device, comprising:
forming an insulating film so as to cover a surface of a semiconductor substrate;
forming an opening in the insulating film;
forming a barrier metal film including a titanium film so as to cover the insulating film including the inside of the opening;
removing, of the barrier metal film, a portion of the titanium film located in an outer peripheral portion of the semiconductor substrate;
forming a tungsten film so as to cover the barrier metal film; and
removing a portion of the barrier metal film and a portion of the tungsten film located over an upper surface of the insulating film, with a portion of the barrier metal film and a portion of the tungsten film located in the opening left,
wherein the removing the portion of the titanium film located in the outer peripheral portion of the semiconductor substrate is performed simultaneously with cleaning a back surface of the semiconductor substrate by a first cleaning chemical liquid.

13. A manufacturing method of a semiconductor device, comprising:
forming an insulating film so as to cover a surface of a semiconductor substrate;
forming an opening in the insulating film;
forming a barrier metal film including a titanium film so as to cover the insulating film including the inside of the opening;
removing, of the barrier metal film, a portion of the titanium film located in an outer peripheral portion of the semiconductor substrate;
forming a tungsten film so as to cover the barrier metal film; and
removing a portion of the barrier metal film and a portion of the tungsten film located over an upper surface of the insulating film, with a portion of the barrier metal film and a portion of the tungsten film located in the opening left,
wherein the removing the portion of the titanium film located in the outer peripheral portion of the semiconductor substrate is performed by spraying a second cleaning chemical liquid onto the outer peripheral portion of the semiconductor substrate or by performing a plasma etching processing on the outer peripheral portion of the semiconductor substrate.

* * * * *